United States Patent
Schmuland

(10) Patent No.: US 9,077,372 B1
(45) Date of Patent: Jul. 7, 2015

(54) VARIABLE LENGTH PHASE FACTOR QUANTIZER

(71) Applicant: The United States of America as Represented by the Secretary of the Air Force, Washington, DC (US)

(72) Inventor: Todd E. Schmuland, Pemberville, OH (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 0 days.

(21) Appl. No.: 14/266,776

(22) Filed: Apr. 30, 2014

Related U.S. Application Data

(60) Provisional application No. 61/817,466, filed on Apr. 30, 2013.

(51) Int. Cl.
*H04N 7/26* (2006.01)
*H03M 7/40* (2006.01)
*H03M 1/00* (2006.01)

(52) U.S. Cl.
CPC ...... *H03M 7/40* (2013.01); *H03M 1/00* (2013.01); *H03M 7/4006* (2013.01)

(58) Field of Classification Search
CPC .................................. H03M 7/40; H03M 7/4006
USPC ................... 341/200, 67; 375/240.02, 240.03, 375/240.12
See application file for complete search history.

(56) References Cited

U.S. PATENT DOCUMENTS

| | | | | |
|---|---|---|---|---|
| 5,930,750 A | * | 7/1999 | Tsutsui | 704/229 |
| 6,307,557 B1 | * | 10/2001 | Deering | 345/428 |
| 6,493,384 B1 | * | 12/2002 | Mihara | 375/240.02 |
| 8,340,448 B2 | * | 12/2012 | Li et al. | 382/246 |

* cited by examiner

*Primary Examiner* — Brian Young
(74) *Attorney, Agent, or Firm* — AFMCLO/JAZ; Fredric Sinder

(57) ABSTRACT

Optimized fully parallel mapped FFT structures where the bit-length of each phase factor used by the FFT is adjusted to meet a quality criteria of phase angle accuracy in terms of error percentage relative to $\pi/4$. Two quantization methods of round-to-zero and round-to-nearest are described.

1 Claim, 3 Drawing Sheets

VARIABLE LENGTH PHASE FACTOR QUANTIZER

CROSS-REFERENCE TO RELATED APPLICATIONS

This application claims the benefit of the filing date of provisional application Ser. No. 61/817,466, filed Apr. 30, 2013, titled "Variable Length Phase Factor Quantizer," and incorporates its contents by reference into this application.

RIGHTS OF THE GOVERNMENT

The invention described herein may be manufactured and used by or for the Government of the United States for all governmental purposes without the payment of any royalty.

BACKGROUND OF THE INVENTION

The present invention relates generally to hardware-based, fixed-point filter-banks, and more specifically to fully parallel Fast Fourier Transform (FTT) structures with constant phase (or twiddle) factors that can be optimized in hardware.

Filter-banks, such as Fast Fourier Transforms (FFTs), typically use normalized complex rotation operators called phase factors. Usually the phase factors are quantized using a fixed length quantizer without regard to their angle accuracy. The fixed length is chosen to be arbitrarily large, which can lead to wasteful hardware usage for phase factors with little benefit to filter-bank performance.

Additionally, such phase factor quantizers typically use a round-to-zero approach without considering the benefits of a round-to-nearest approach.

Fast Fourier Transforms are algorithms for computing Discrete Fourier Transforms (DFTs) faster and more efficiently. They are particularly valuable for implementing in computer hardware. FFTs are particularly well suited for use in massively parallel hardware, such as Field Programmable Gate Arrays (FPGAs) and Application-Specific Integrated Circuits (ASICs).

An FFT structure consists of simple addition, subtraction, and complex rotation operators with phase factors as given by:

$$F_k = \sum_{n=0}^{N/2-1} e^{-j2\pi nk/(N/2)} f_{2n} + W^k \sum_{n=0}^{N/2-1} e^{-j2\pi nk/(N/2)} f_{2n+1}, \quad (1)$$

where $W^k$ are commonly referred to as phase or twiddle factors.

Traditionally, FFT structures have been constructed by re-using Digital Signal Processing (DSP) blocks and storing phase factors in ROM tables. However, with FPGAs and ASICs, it is possible to construct a fully parallel FFT structure where every algorithm component is fully implemented in concrete hardware.

This fully mapped structure means that phase factors are now constants and a good opportunity for hardware optimization. Because phase factors are constants, the complex rotation operator becomes a set of constant multipliers that can be implemented using a series of shifted adders. The number of required adders is dictated by the bit-length of the phase factors and the number of one bits that represent them. If the fixed-point length of the phase factors can be varied per factor k, while still maintaining adequate accuracy, then fewer adders will be required to implement an FFT.

Conventional approaches for determining the number of bits needed for phase factors are based on trial and error methods requiring thousands of time consuming simulation runs.

There is, therefore, a need for a variable length phase factor quantizer.

SUMMARY OF THE INVENTION

The teachings of this invention solves that need by providing a quality metric for allowed phase angle error percentage as a control for a variable length phase factor quantizer.

By varying the fixed-point length of the phase factors using phase angle error percentage as a control for the variable length phase factor quantizer, the number of shifted adders required to implement the complex rotation operators in hardware can be reduced.

The teachings of the invention also include choosing between round-to-zero and round-to-nearest rounding modes for balancing accuracy against shorter phase factor lengths.

BRIEF DESCRIPTION OF THE DRAWINGS

The teachings of the present invention will be better understood from the accompanying drawings illustrating various aspects and example embodiments of the invention and its teachings.

DETAILED DESCRIPTION

Fast Fourier Transforms (FFTs) are highly parallel in nature and consist of simple addition, subtraction, and complex rotation operators with phase factors, also known as twiddle factors. With the advent of Field Programmable Gate Arrays (FPGAs) and other reconfigurable seas-of-logic, it is now possible to construct a fully parallel FFT structure where the phase factors are now constants, and good targets for hardware optimization. By varying the fixed-point length of the phase factors using phase angle error percentage as a quality control for the variable length phase factor quantizer, the number of shifted adders required to implement complex rotation operators can be reduced.

Additional details of the teachings of the present invention, including performance comparisons, are in Schumland, T. E., et al., "Optimize Hardware with Fixed-Point Variable Length Phase Factors," New Circuits and Systems Conference (NEWCAS), 2011 IEEE 10$^{th}$ International, Jun. 17-20, 2012, which paper is included in the cross-referenced provisional patent application, and is fully incorporated by reference into this description.

The present invention provides a method for providing variable length phase (or twiddle) factors for use in hardware-based fixed-point filter-banks with emphasis on reducing the total number of adders to implement the phase factor multipliers while maintaining accurate representation of the phase factor angle.

The variable length phase factor is a quantized, signed, binary fixed-point representation of an ideal phase factor that allows a tradeoff between hardware usage and phase factor angle accuracy, significantly improving overall performance of a filter-bank.

Variable length phase factors allow the complex rotation operator to achieve a given amount of accuracy while minimizing the hardware required to implement the complex rotation operator. By providing a quality metric of allowed phase error, the phase factor quantizer can find an optimal variable length representation required to achieve a given amount of accuracy.

Figure 1:
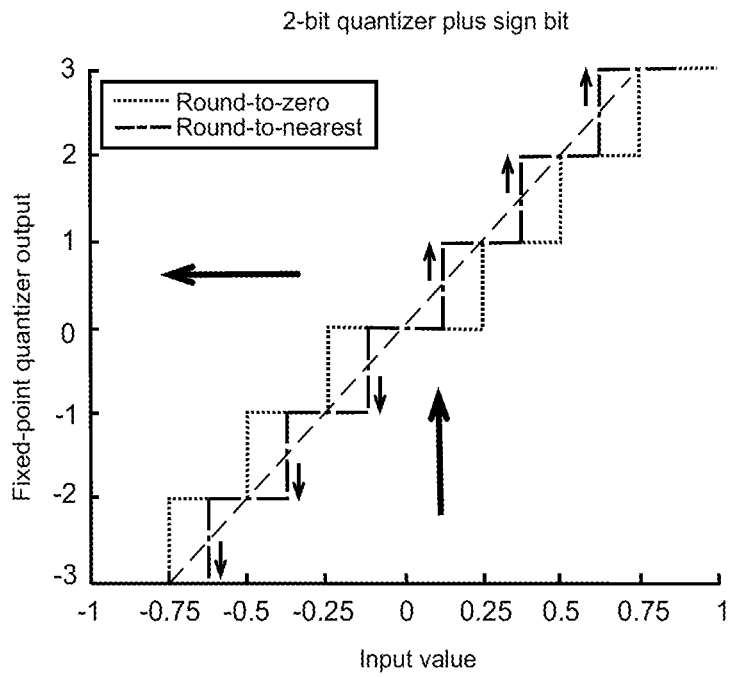
FIG. 1 is a graph showing a 2-bit quantizer comparison of round-to-zero and round-to-nearest approximations.

Rounding mode selection of the phase factor quantizer also has an impact on variable length representation and complex rotation accuracy. Two modes are considered, round-to-zero and round-to-nearest. FIG. 1 shows the relationship between the two modes for a simple 2-bit signed quantizer. Round-to-zero is safest to use as it always underestimates the target value; however, the phase factor lengths are generally longer than round-to-nearest to achieve a given accuracy. On the other hand, round-to-nearest sometimes overestimates the target value, but the phase factor lengths are generally shorter than round-to-zero to achieve the same accuracy.

Phase factors consist of a real component and an imaginary component taken from the quantized cosine curve. Normalized complex rotation operators ideally should have a magnitude of one. By using the same quality metric of allowed phase error for both real and imaginary components, the phase factor quantizer will naturally find a variable length representation that approaches a magnitude of one.

Phase balance in terms of phase factor angle accuracy is important for overall filter-bank performance. All phase factors used in a filter-bank should have a uniform deviation from their ideal angle values. When traditional fixed length phase factors are used, some phase factors will be more accurate than others, whereas variable length phase factors strive to achieve a uniform deviation of all the phase factor angles used in the filter-bank. The phase imbalance inherent in a fixed length phase factor filter-bank results in unwanted artifacts appearing in the filter output.

Figure 2:
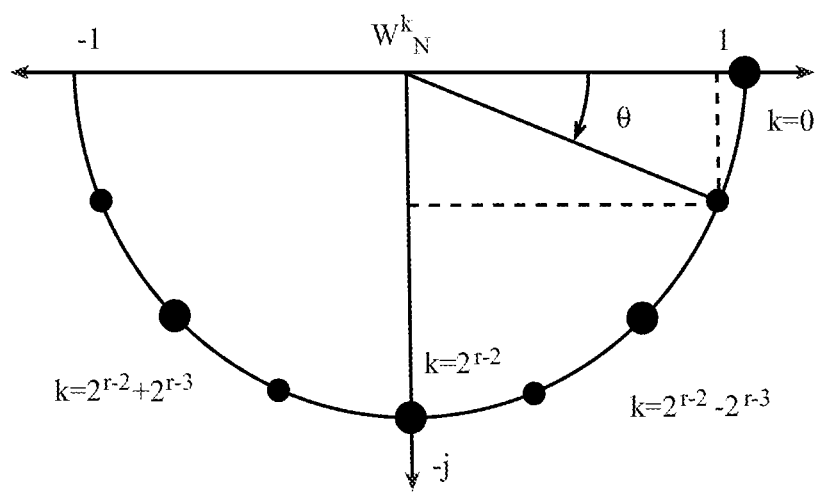
FIG. 2 is a graph showing phase factor positions on a unit circle in a complex plane.

A variable length phase factor quantizer according to the teachings of the invention includes a base cosine curve ranging from 0 to π/2 radians, an input quality metric of phase error percentage allowed, and a rounding mode selector of either round-to-zero or round-to-nearest. The base cosine curve is used to construct the real and imaginary parts necessary for the complex rotation operator. FIG. 2 shows the positions of phase factors on the unit circle in the complex domain. $W_N^k$ are the phase factors (commonly known as the twiddle factors), defined as:

$$W_N^k = e^{-\frac{j2\pi nk}{N}} \quad (2)$$

where n is the sample index, k is the frequency index, and $N=2^r$ is the size of the FFT. Note that r is an integer.

A variable length phase factor quantizer according to the teachings of the invention primarily relies on that the cosine curve is non-linear. This non-linearity results in more bits being required to accurately represent a phase factor angle as you go from π/2 down to 0 radians. Traditional fixed length phase factors have to make a compromise of under-representing the cosine curve for angles towards 0 radians and over-representing the cosine curve for angles towards π/2 radians. This trade-off results in wasted hardware resources and unwanted artifacts in the output of an implemented filter-bank system using fixed length phase factors. A variable length phase factor based filter-bank does not need to consider this trade-off.

Figure 4:
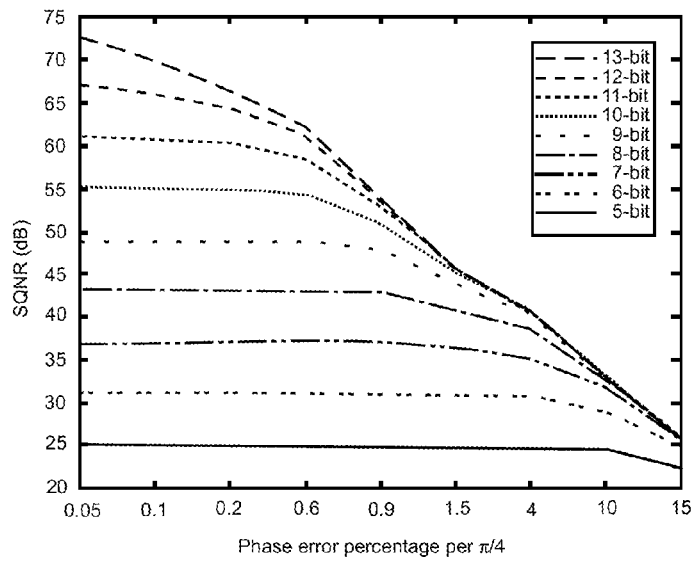
FIG. 4 is a graph of SQNR curves for a 64-point FFT with various word sizes and allowed phase error percentages.

The process for determining variable length phase factor values is straightforward. The first step is to select an acceptable phase error percentage according to the system parameters of input word size and required Signal-to-Quantized Noise Ratio (SQNR). FIG. 4 shows the SQNR achievable for various phase angle error percentages and input word sizes for a 64-point FFT. SQNR is calculated by comparing the fixed-point output with the floating-point output as:

$$SQNR = 10\log_{10} \frac{\sum_{k=0}^{N-1} |X_q(k)|^2}{\sum_{k=0}^{N-1} |X_q(k) - X'_q(k)|^2} \quad (3)$$

where $X_q(k)$ is the floating-point output and $X'_q(k)$ is the fixed-point output. A −1 dBFS sinusoidal tone was swept across the frequency range at ⅛th bin steps and the minimum SQNR seen for the entire sweep was plotted. To minimize hardware usage, one should select a phase error percentage at or near the knee on the appropriate input word size curve.

The second step is to select the desired rounding mode according to the criteria of the system. If the input signal is real only, or the input signal magnitude is less than ≈2 dB, then round-to-nearest should be used to maximize hardware savings. Once those two hardware parameters are selected, then the following steps are used to quantize each cosine base value.

(1) Read input of phase error percentage
(2) Read input of cosine target angle
(3) Read input of desired rounding mode
(4) Start quantizer at 2-bits of precision
(5) Quantize cosine target angle value using desired rounding mode
(6) Compare angle of quantized value to target angle
(7) If angle difference is within phase error percentage then stop
(8) Otherwise add 1 bit of precision to quantizer
(9) Return to step 5

Figure 3:
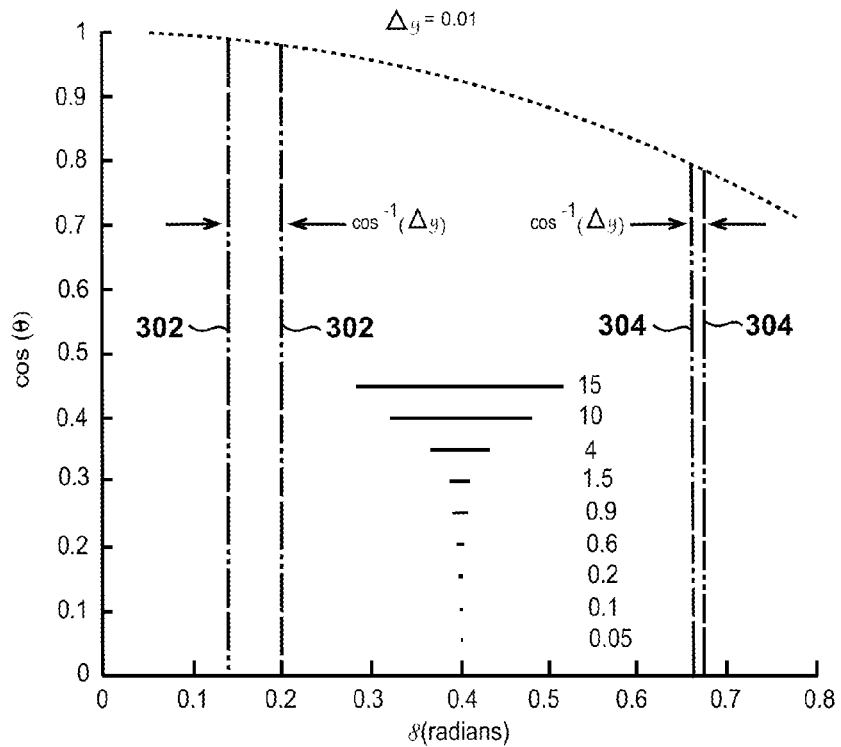
FIG. 3 is a graph showing cosine angle versus slope and typical phase angle percentages.

The resulting variable length cosine value is then used as either the real or imaginary component of the phase factor. Due to symmetry, all phase factors on the unit circle can be constructed by using the base cosine values from 0 to π/2 radians simply by changing their sign and their location as the real or imaginary part of the phase factor. FIG. 3 shows the relationship of the non-linear cosine slope versus cosine angle and typical values used for phase error percentage, ranging from 0.05% to 15%, for an example target angle of 0.4 radians. Phase error percentage is in relation to π/2. Lines 302 and 304 show the phase angle error bound for the same Δy=0.01 and how the range decreases for angles near π/2 radians.

Figure 5:
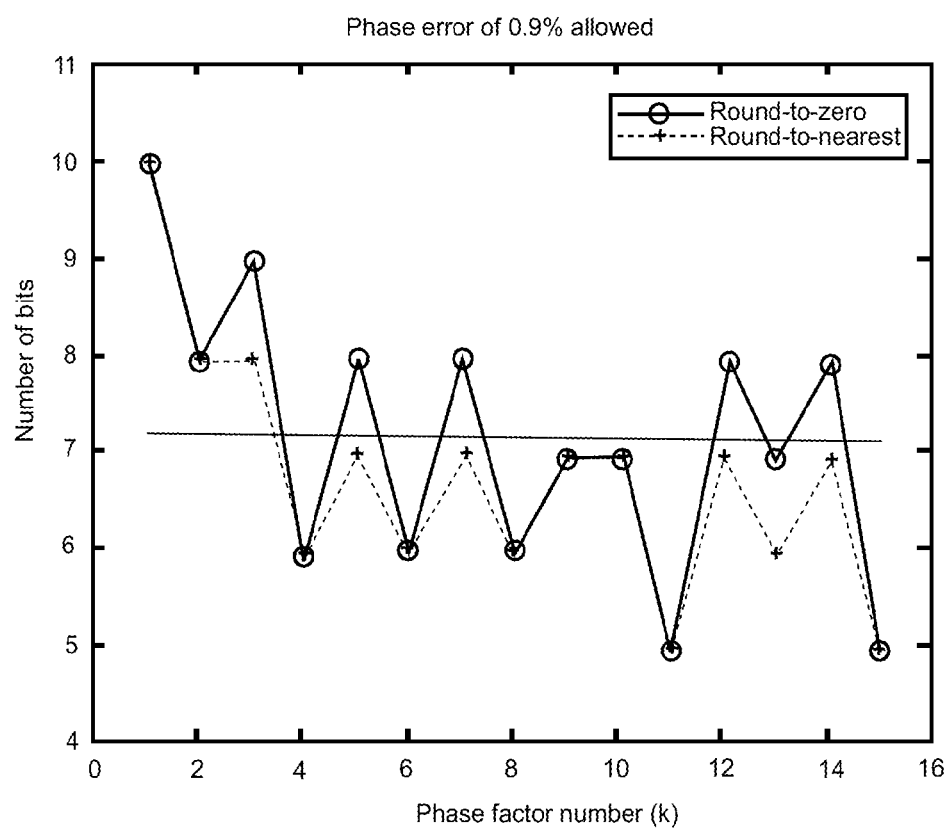
FIG. 5 is a graph of magnitude comparison of round-to-zero and round-to-nearest phase factors with a 0.9% allowed phase error.

From the set of cosine base values, the phase factor real and imaginary components are selected (with simple sign inversions when necessary). FIG. 5 shows the resulting phase factor lengths, in bits, for each phase factor of a 64-point FFT with 0.9% allowed phase error. One can clearly see that phase factors 1, 2 and 3 require more bits to accurately represent the phase angle. This stems from that the real component lies near the top of the cosine curve, thus requiring more bits to meet the allowed amount of phase angle error. FIG. 5 also shows that round-to-nearest always uses the same or fewer bits to represent the same phase factor as round-to-zero.

A short listing of example MATLAB code demonstrating an example implementation of a variable phase factor algorithm according to the teachings of the invention is included at the end of this description.

The teachings of the present invention have a variety of advantages over fixed length phase factor quantizers determining normalized complex rotation phase factors.

Phase Balance is Maintained:

Because a quantizer according to the teachings of the present invention focuses on achieving a good representation of the phase angle, an even variance of phase factor angles is achieved across the entire filter-bank. This prevents unwanted artifacts from appearing in the filter-bank output.

Bit Allocation is Optimized:

The quantizer allocates to each phase factor only as many bits as are needed to achieve the desired phase accuracy. The resulting variable length phase factors eliminate the compromise that fixed length phase factors force the designer to make.

Performance is Improved:

Two measures of performance are improved: (1) less hardware is required to implement the normalized complex rotation operators of a filter-bank; and, (2) Unwanted artifacts do not appear in the filter-bank output.

Various modifications to the invention as described may be made, as might occur to one with skill in the art of the invention, within the scope of the claims. Therefore, all contemplated example embodiments have not been shown in complete detail. Other embodiments may be developed without departing from the spirit of the invention or from the scope of the claims.

COMPUTER PROGRAM LISTING

```
fparam = [4, 2, 0, true, 0, 8, 8, 1, 0, false, 0, false, 8, false];
fdepth = fparam(1);      %number of FFT stages, FFT size is 2^fdepth
fradix = fparam(2);      %butterfly radix to be used (2 or 4)
ftype = fparam(3);       %0 = DIT, 1 = DIF, 2 = split-radix
fround = fparam(4);      %true = round-to-zero, false = truncate
qi = fparam(5);          %number of integer bits
qf = fparam(6);          %number of fraction bits
tbits = fparam(7);       %maximum twiddle factor bits allowed
                          for each twiddle factor
terr = fparam(8);        %base cosine phase error % (radians) relative
                          to pi/4
tround = fparam(9);      %twiddle quantizer: 0 = round-to-zero,
                          1 = round-to-nearest
verbose = fparam(10);    %true = display stats, false = quiet
bmath = fparam(11);      %0 = parallel-parallel, 1 = serial-parallel butterflies
vgen = fparam(12);       %generate VHDL if true
fscale = fparam(13);     %scale output to fscale number of bits
fmult3 = fparam(14);     %true = 3 mult, false = 4 mult per complex mult
twbr = zeros((2^fdepth)*3/4, tbits + 1);    %binary twiddle factor, real part
twbi = zeros((2^fdepth)*3/4, tbits + 1);    % imaginary part
twfr = zeros((2^fdepth)*3/4, 1);    %ideal twiddle factor, real part
twfi = zeros((2^fdepth)*3/4, 1);    % imaginary part
for ii = 0:(2^fdepth)/4 - 1
   twfr(ii + 1) = cos(ii*2.0*pi/(2^fdepth));
   twbr(ii + 1, 1) = 0;
   for kk = 1:tbits
      b = 0.0;
      c = 1.0;
      if tround == 1
         df = twfr(ii + 1) + 0.5^(kk + 1);
         if twfr(ii + 1) >= 1.0 - 0.5^(kk + 2)    %can not represent with
current number of tbits
            continue;
         end
      else
         df = twfr(ii + 1);
      end
      for jj = 2:kk + 1
         c = c/2.0;
         if b + c <= df
            twbr(ii + 1, jj) = 1;
            b = b + c;
         else
            twbr(ii + 1, jj) = 0;
         end
      end
      ac1 = acos(twfr(ii + 1));
      ac2 = acos(b);
      if abs(100*(ac1 - ac2)/(pi/4)) < terr
         break;
      end
   end
end
%expand base values to real and imag values for 3/4 of unit circle
for ii = 0:(2^fdepth)*3/4 - 1
   if ii < 2^(fdepth - 2)         %first quadrant
      kk = 2^(fdepth - 2) - ii;
      twbi(ii + 1, :) = vfft_tcomp(twbr(kk + 1, :));
      twfi(ii + 1, :) = -twfr(kk + 1);
   elseif ii < 2^(fdepth - 1)     %second quadrant
      jj = 2^(fdepth - 1) - ii;
      kk = 2^(fdepth - 2) - jj;
      twbr(ii + 1, :) = vfft_tcomp(twbr(jj + 1, :));
      twbi(ii + 1, :) = vfft_tcomp(twbr(kk + 1, :));
      twfr(ii + 1, :) = -twfr(jj + 1);
      twfi(ii + 1, :) = -twfr(kk + 1);
   else        %third quadrant
      jj = ii - 2^(fdepth - 1);
      kk = 2^(fdepth - 2) - jj;
      twbr(ii + 1, :) = vfft_tcomp(twbr(jj + 1, :));
      twbi(ii + 1, :) = twbr(kk + 1, :);
      twfr(ii + 1, :) = -twfr(jj + 1);
      twfi(ii + 1, :) = twfr(kk + 1);
   end
end
```

I claim:

1. A method for quantizing variable length phase factors for a Fast Fourier Transform (FFT) integrated circuit structure, comprising the steps of:
   (a) receiving a minimum phase error percentage;
   (b) receiving a selected rounding mode;
   (c) receiving an initial target cosine angle value;
   (d) set a phase factor length at 2 bits of precision;
   (e) quantize a cosine phase factor angle value using the selected rounding mode;
   (f) compare the quantized cosine phase factor angle to the target cosine target angle to determine a percentage angle difference; and,
      (i) if the percentage angle difference is less than or equal to the minimum phase error percentage, then output phase factor length; and,
      (ii) if there is a next target cosine angle value, read the next target cosine angle and return to step (d); otherwise,
      (iii) if the percentage angle difference is greater than the minimum phase error percentage, then add 1 bit of precision to phase factor length and return to step (e).

* * * * *